(12) United States Patent
Chen et al.

(10) Patent No.: US 7,642,617 B2
(45) Date of Patent: Jan. 5, 2010

(54) INTEGRATED CIRCUIT WITH DEPLETION MODE JFET

(75) Inventors: Alan Sangone Chen, Windermere, FL (US); Daniel J. Dolan, Jr., Cottage Grove, MN (US); David W. Kelly, Lino Lakes, MN (US); Daniel Charles Kerr, Orlando, FL (US); Stephen C. Kuehne, Rosemount, MN (US)

(73) Assignee: Agere Systems Inc., Allentown, PA (US)

( * ) Notice: Subject to any disclaimer, the term of this patent is extended or adjusted under 35 U.S.C. 154(b) by 413 days.

(21) Appl. No.: 11/237,095

(22) Filed: Sep. 28, 2005

(65) Prior Publication Data

US 2007/0069250 A1 Mar. 29, 2007

(51) Int. Cl.
*H01L 21/331* (2006.01)

(52) U.S. Cl. .............................. 257/504; 257/E29.265; 257/256

(58) Field of Classification Search .................. 257/256, 257/E29.265, E21.421, 504
See application file for complete search history.

(56) References Cited

U.S. PATENT DOCUMENTS

2005/0179089 A1* 8/2005 Shimizu ..................... 257/358

FOREIGN PATENT DOCUMENTS

GB 2066571 A * 7/1981

* cited by examiner

*Primary Examiner*—Lynne A. Gurley
*Assistant Examiner*—Colleen A Matthews
(74) *Attorney, Agent, or Firm*—Mendelsohn, Drucker & Associates, P.C.; Yuri Gruzdkov; Steve Mendelsohn

(57) ABSTRACT

An integrated circuit having an n-channel MOSFET device and a JFET device. The integrated circuit includes a semiconductor layer having an upper surface, an MOS transistor device formed in a doped well of a first conductivity type extending from the semiconductor upper surface and a JFET device. The JFET device includes a channel region in the semiconductor layer spaced from, and having a peak concentration positioned a predetermined distance below, the upper surface. An associated method of manufacturing includes introducing p-type dopant into the semiconductor surface to form a p-well in which the NMOS device is formed and a source and a drain of the JFET device. N-type dopant is introduced into the semiconductor surface to form an n-type region of the NMOS device below the p-well and a gate region of the JFET device. P-type dopant is introduced into the semiconductor layer to simultaneously form a higher concentration p-type region in the p-well of the NMOS device and a channel region extending between the source and drain of the JFET.

10 Claims, 16 Drawing Sheets

INTEGRATED CIRCUIT WITH DEPLETION MODE JFET

FIELD OF THE INVENTION

The present invention relates to integrated circuit devices and, more specifically, to structures and methods for fabricating a junction field effect transistor in combination with an MOS transistor in an integrated circuit device.

BACKGROUND OF THE INVENTION

It is sometimes desirable to have an individual transistor device on a semiconductor integrated circuit in a conductive state in the absence of a supply voltage. Depletion-mode Field Effect Transistors (FETs) are commonly provided for this function. Depletion-mode Metal Oxide Semiconductor Field Effect Transistors (MOSFETs) conduct current through a channel region in the absence of an applied voltage. However, under a bias condition, the normally "on" FET channel becomes depleted of charge carriers, effectively stopping channel conduction and turning the device off.

Such transistors are useful for applications such as eliminating charge build-up in sensitive circuitry. In one example application, a MOSFET may protect the read head of a mass storage disk drive from damage. The depletion mode device provides a low resistance path to ground when power to the head is turned off. During normal circuit operation, when the power is turned on, voltage is applied to the gate to remove the path to ground. Thus, the depletion-mode device suppresses static charge build-up while not interfering with circuit operation.

Although depletion-mode MOSFETs are effective devices for such applications, integration of these devices into an MOS fabrication process adds cost. It is a desire in the industry to provide methods and devices which implement depletion mode transistors at lower costs.

SUMMARY OF THE INVENTION

In one form of the invention an integrated circuit device includes a semiconductor layer having an upper surface and a plurality of CMOS device pairs formed along the upper semiconductor surface. A junction field effect transistor (JFET) device is also formed along the upper semiconductor surface. The JFET device includes a channel region of a first conductivity type formed in the semiconductor layer spaced from the upper surface, a gate region of a second conductivity type positioned in the semiconductor layer and a source region and a drain region of the first conductivity type extending from the semiconductor upper surface, the source and drain regions contacting opposing ends of the channel region. An associated method of manufacturing the integrated circuit includes forming a plurality of CMOS transistor device pairs along the upper semiconductor surface, as well as forming a JFET device. Dopant of a first conductivity type is introduced substantially below the surface of the semiconductor layer to form a channel region of the JFET device. Dopant of the first conductivity type is also introduced in each of two regions at opposing ends of the channel to form a source and a drain wherein the source and drain each contact the channel and extend to the surface of the semiconductor layer. Dopant of a second conductivity type is introduced in the semiconductor layer to form a gate region.

There is also provided an integrated circuit having an n-channel MOSFET device and a JFET device. The integrated circuit includes a semiconductor layer having an upper surface, an MOS transistor device formed in a doped well of a first conductivity type extending from the semiconductor upper surface and a JFET device. The JFET device includes a channel region formed in the semiconductor layer spaced from, and having a peak concentration positioned a predetermined distance below, the upper surface. An associated method of manufacturing an integrated circuit includes introducing p-type dopant into a plurality of regions in the semiconductor surface such that at least one of the regions forms a p-well in which the NMOS device is formed and at least two other regions form a source and a drain of the JFET device. N-type dopant is introduced into a plurality of regions in the semiconductor surface such that at least one of the regions forms an n-type region of the NMOS device below the p-well and at least one other of the regions forms a gate region of the JFET device. A p-type dopant is introduced into the semiconductor layer to simultaneously form a higher concentration p-type region in the p-well of the NMOS device and a channel region extending between the source and drain of the JFET.

BRIEF DESCRIPTION OF THE DRAWINGS

The foregoing and other features of the invention will be apparent from the following description, as illustrated in the accompanying drawings, in which like reference characters refer to like features throughout the figures. The drawings are not necessarily to scale, emphasis instead being placed upon illustrating specific features pertinent to the present invention so as not to obscure the disclosure with details that will be readily apparent to those skilled in the art.

DETAILED DESCRIPTION OF THE INVENTION

Figure 1:
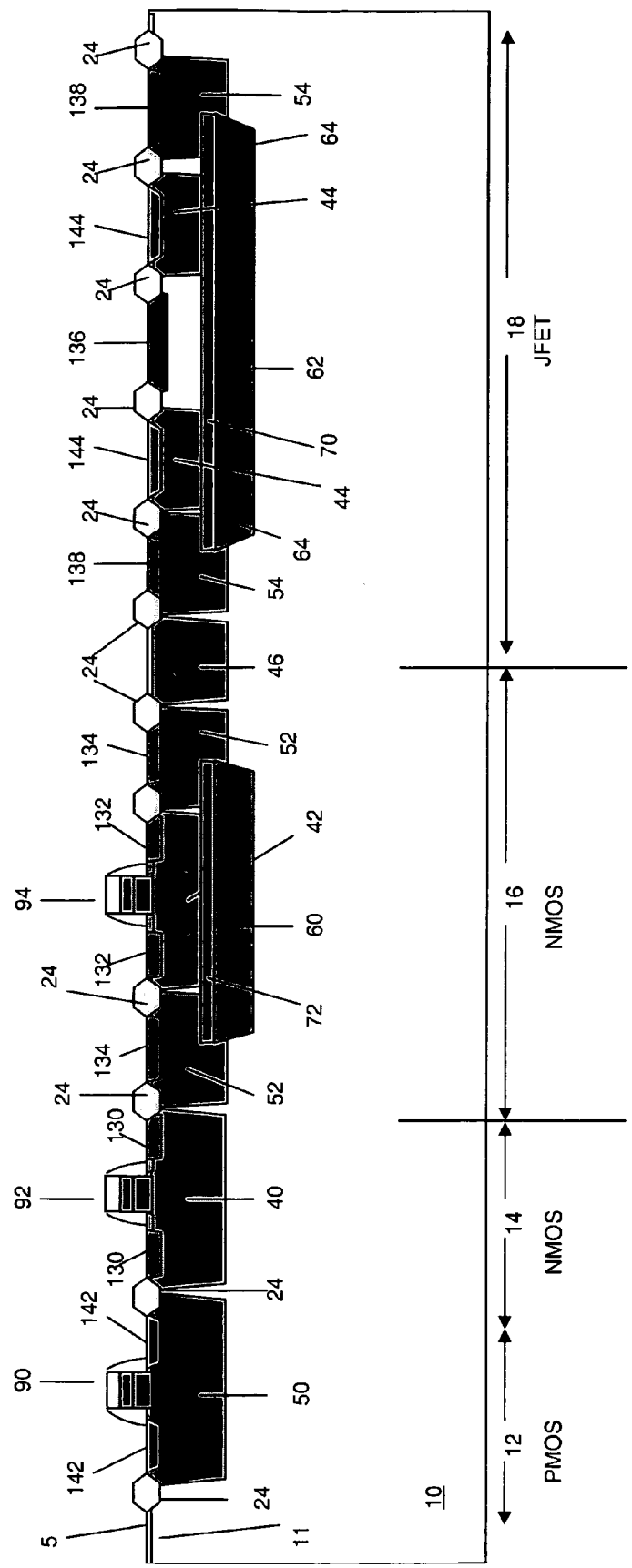
FIG. 1 is a cross-sectional illustration of a portion of a semiconductor integrated circuit device according to the present invention.

FIG. 1 illustrates portions of an integrated circuit device 1 containing enhancement mode transistors 2, 4, and 6, and a depletion mode JFET device 8, formed along a semiconductor layer 10 having an upper surface 11. Layer 10 may be an epitaxially grown, lightly p-doped layer formed on a silicon substrate. Throughout the figures, regions 12, 14, 16, and 18, in which the differing transistor devices are formed, are shown side by side, for the purpose of illustrating the invention. It is to be understood that these regions may be further isolated from one another or positioned on different portions of the integrated circuit. A CMOS transistor pair is formed in regions 12 and 14. In region 12, a PMOS transistor 2 is formed in an n-well 50 and includes source/drain regions 142 and a gate structure 90. In region 14, an NMOS transistor 4 is formed in a p-well 40 and includes source/drain regions 130 and a gate structure 92. In region 16, an NMOS transistor 6 is formed in a p-well 42 surrounded by n-type isolation region 52 and underlying n-type region 60. The NMOS transistor 6 includes source/drain regions 132 and gate structure 94, as well as n-type contact regions 134 and a separately formed, laterally extending p-type region 72 positioned along a lower portion of the p-well 42. A p-channel JFET 8, formed in region 18, includes a p-doped channel region 70 operatively positioned between an upper gate region 136 and a lower gate region 62, each of which are formed in semiconductor material having a net n-type concentration. Source/drain contact regions 144 each extend from the semiconductor surface 11 into an underlying one of the source/drain regions 44. N-region 54 extends from n-contacts 138 at the semiconductor surface 11 to the extended gate region 64.

Figure 2:
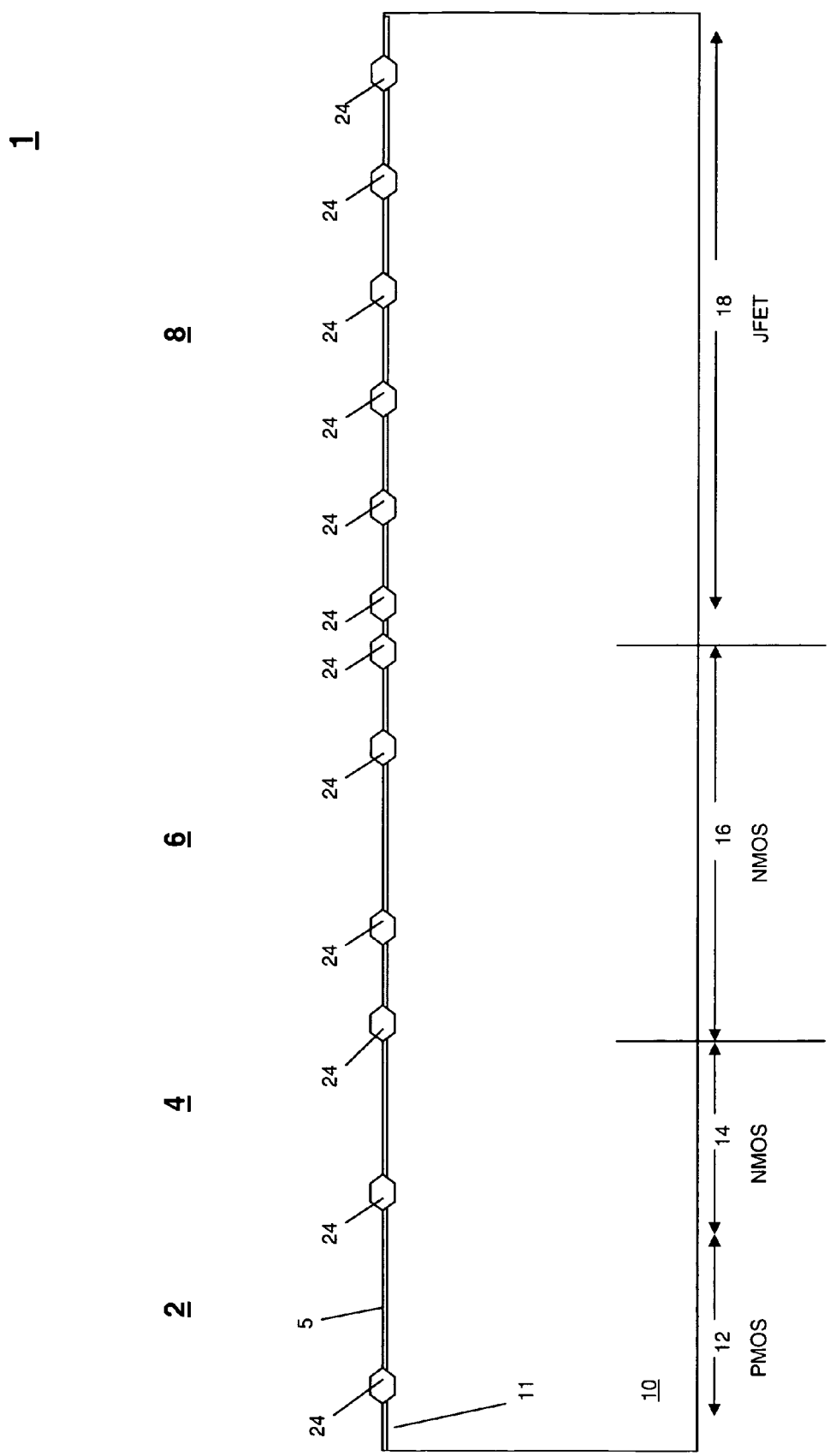
FIGS. 2 though 12 are cross-sectional views illustrating sequential steps of forming the integrated circuit device of FIG. 1.

A process for forming the integrated circuit 1 is illustrated beginning with the formation of silicon oxide isolation regions 24 formed, for example, by a local oxidation of silicon (LOCOS) technique, to electrically isolate the upper portions of regions 12, 14, 16, and 18 along the surface 11, as shown in FIG. 2. Other isolation techniques, such as the formation of shallow or deep trench isolation may be used instead of the LOCOS technique, where all of these techniques are suitable to form the JFET structure of the present invention. A thin, sacrificial layer 5 of silicon oxide is formed on the surface 11 of the semiconductor layer 10.

Figure 3:
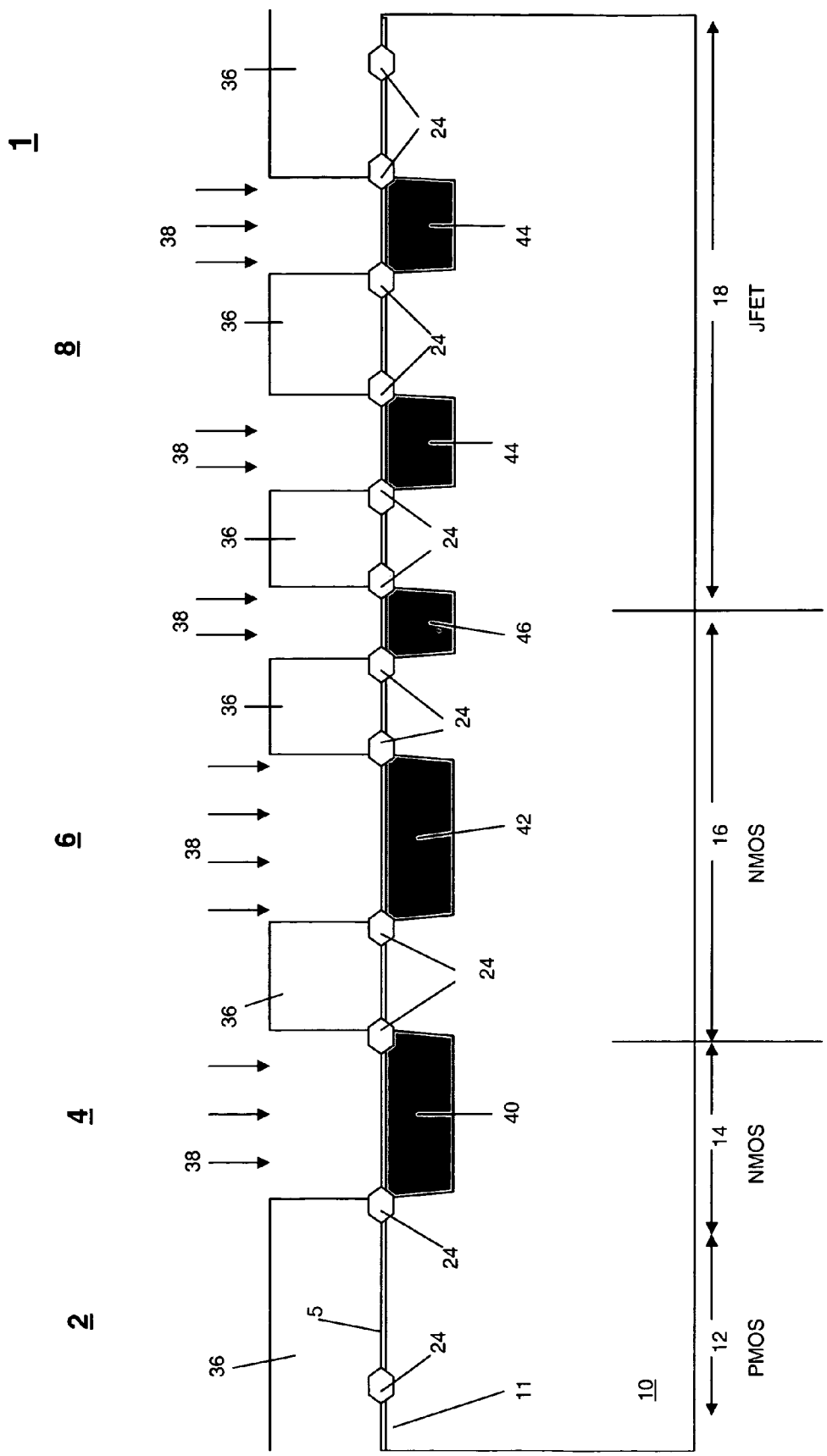

As illustrated in FIG. 3, a photo resist layer 36 is deposited and patterned, followed by a p-type implant process 38 simultaneously forming p-wells 40 and 42 for the NMOS devices 4 and 6, and creating source/drain regions 44 for the JFET 8. The implant process 38 also forms a p-type region 46 between the NMOS 6 and JFET 8 to provide an isolation region extending beneath an adjoining pair of isolation regions 24. The process 38 may include multiple implantation steps to create uniform regions of p-type dopant. For example, a $2\times10^{13}$ cm$^{-2}$ dose of boron, implanted at an energy on the order of 240 keV, may be followed by a second $2\times10^{13}$ cm$^{-2}$ dose of boron, implanted at an energy on the order of 90 keV, followed by a third, heavier but lower energy implant, e.g., a $5\times10^{12}$ cm$^{-2}$ dose of BF$_2$ implanted with an energy on the order of 40 KeV. Subsequently, with conventional plasma etch and clean techniques, photo resist layer 36 is removed and the semiconductor surface 11 is cleaned.

Figure 4:
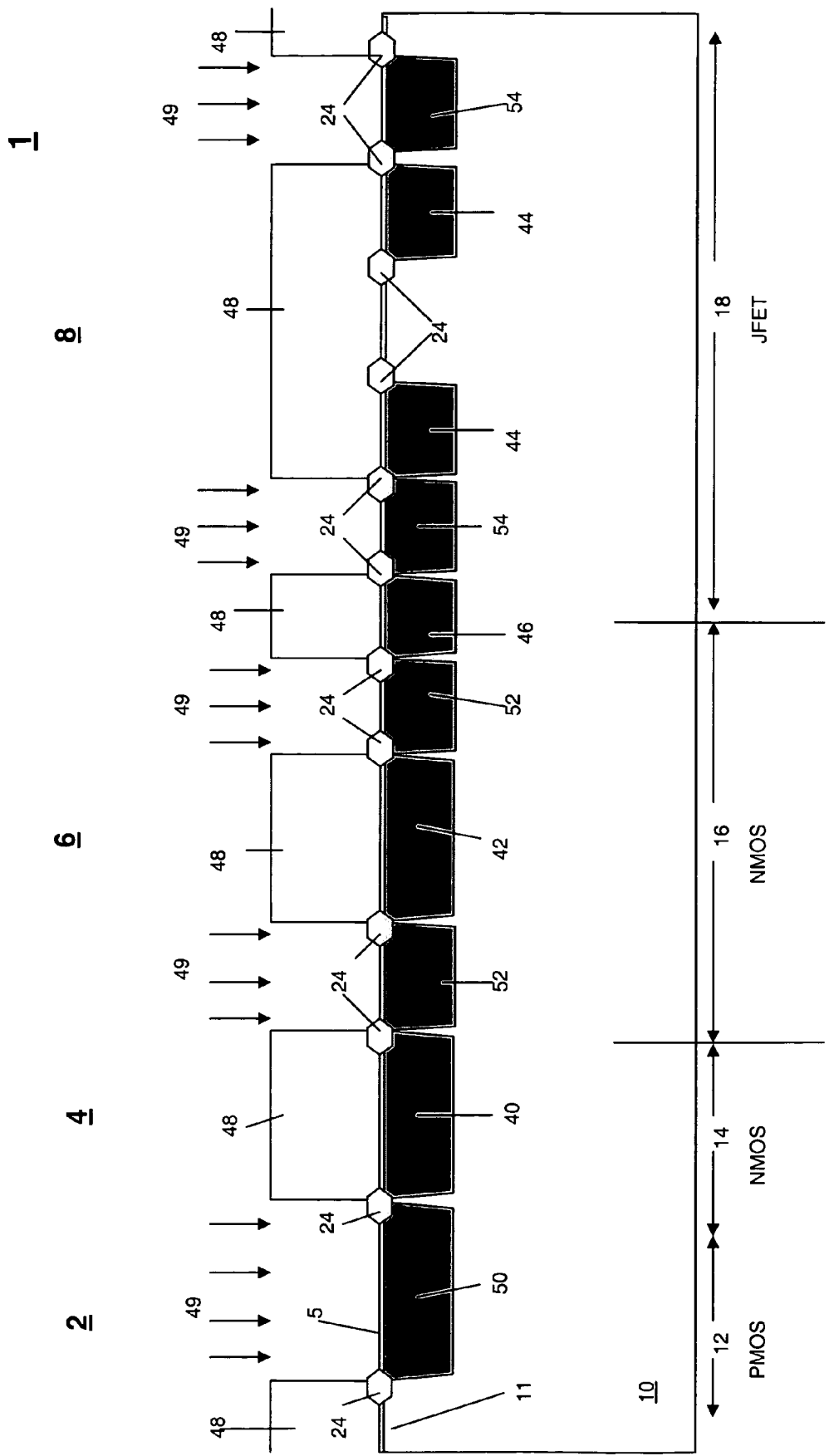

Referring next to FIG. 4, a second photo resist layer 48 is deposited and patterned, and an n-type implant process 49 simultaneously forms the n-well 50 of the PMOS transistor 2 and an n-type isolation region 52 which surrounds the p-well 42 of the NMOS transistor 6. Simultaneously, implant process 49 also forms n-region 54 which provides electrical connection to the lower gate 62 and the upper gate 136. Implant process 49 may include multiple implantation steps to create a relatively uniform region of n-type dopant, with a relatively thin surface region of p-type dopant disposed thereover. For example, a $1.5\times10^{13}$ cm$^{-2}$ doe of phosphorous, implanted at an energy on the order of 500 keV, may be followed by a $1.2\times10^{13}$ cm$^{-2}$ second dose of phosphorus implanted at an energy on the order of 230 keV followed by a $3\times10^{12}$ cm$^{-2}$ third dose of arsenic implanted at an energy on the order of 170 keV followed by a $7\times10^{12}$ cm$^{-2}$ fourth dose of BF$_2$ implanted at an energy on the order of 40 keV. Conventional techniques are again used to remove the photo resist layer 49 and clean the semiconductor surface 11. Well-known thermal treatments, such as rapid thermal processing (RTP), may be used to establish dopant profiles.

Figure 5:
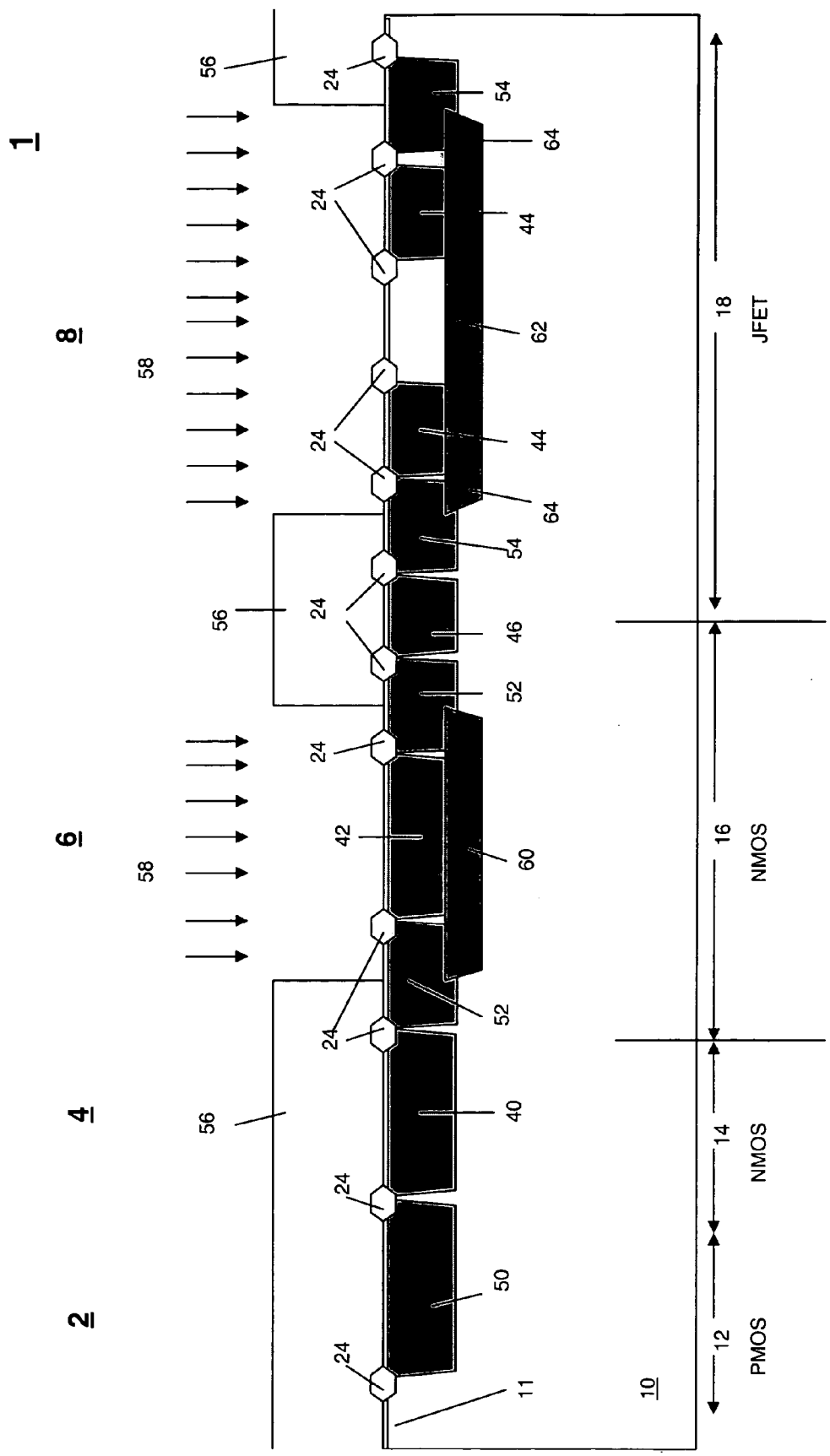

Next, referring to FIG. 5, another photo resist layer 56 is deposited and patterned to define openings which receive an n-type implant 58, forming an n-type region 60 below the p-well 42 and extending below the n-type isolation region 52 of the NMOS transistor 6. Simultaneously, the implant 58 forms lower gate region 62 below the source/drain regions 44 of the JFET 8. The implant 58 also forms an extended gate region 64 below and in electrical contact with n-type region 54. The implant 58 may include a $2\times10^{13}$ cm$^{-2}$ dose of phosphorus implanted at an energy on the order of 1000 keV. In this example, the peak concentration of dopant from implant 58 is approximately 1.3 microns below the surface 11.

As illustrated in FIG. 6, again using the photo resist layer 56, an additional p-type implant 68 defines the p-doped channel region 70 of the JFET 8, between the upper and lower gate regions 136 and 62, and substantially below the surface 11. The channel region 70 may extend laterally through and beyond the source/drain regions 44 and has a peak dopant concentration approximately 0.8 micron below the surface 11 of the layer 10. Alternately, the peak dopant concentration for channel region 70 may be positioned approximately 0.5 micron or more below the semiconductor surface 11, but these features are exemplary and the channel 70 could be closer to the surface 11 or deeper than illustrated. Implant 68 also forms a p-type region 72 within lower portion of the p-well region 42 which may extend laterally into the n-type isolation region 52 of the NMOS device 6. The implant 68 may include a $2\times10^{12}$ cm$^{-2}$ dose of boron implanted with an energy on the order of 275 keV.

Figure 6:
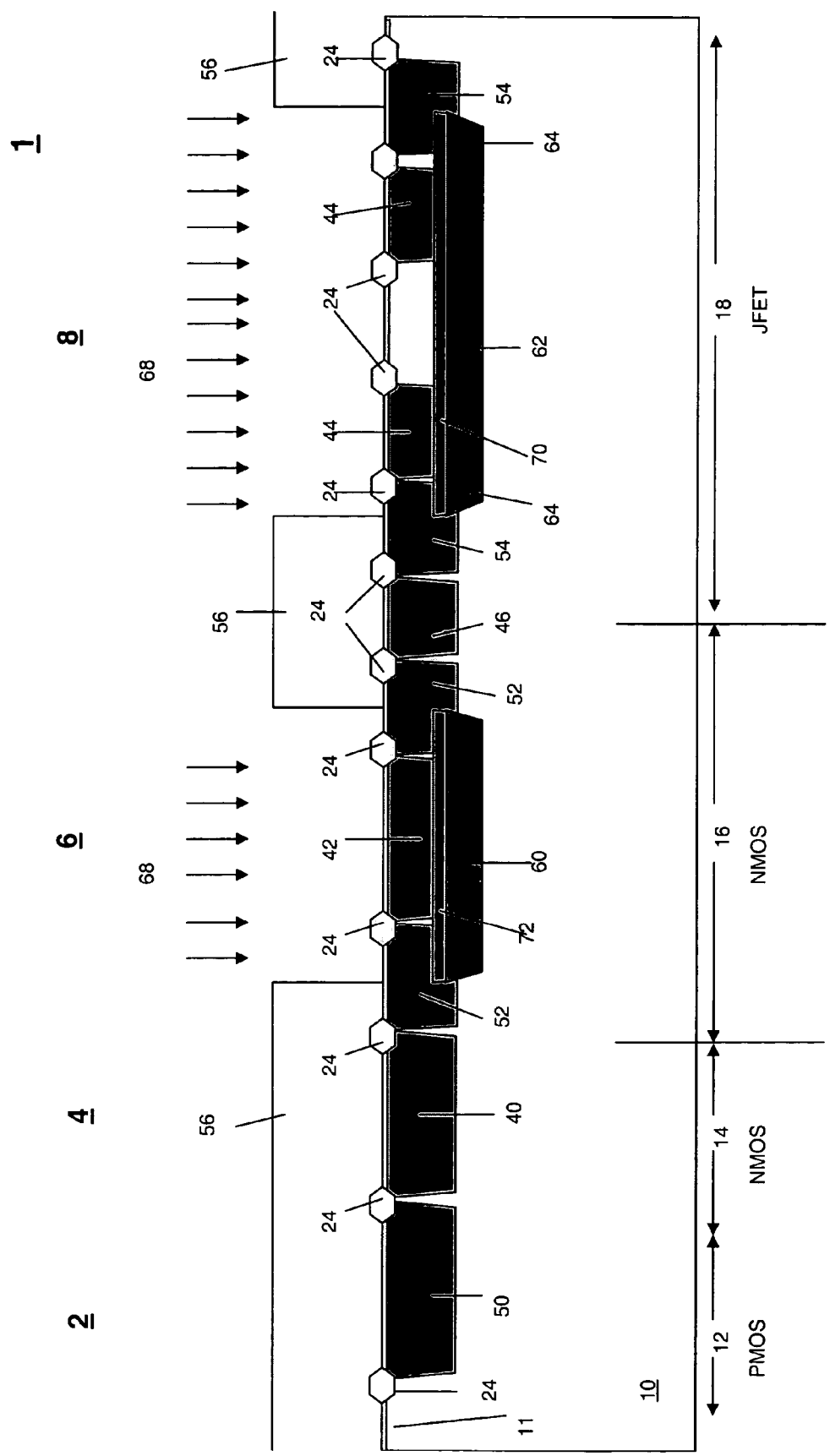
Figure 7:
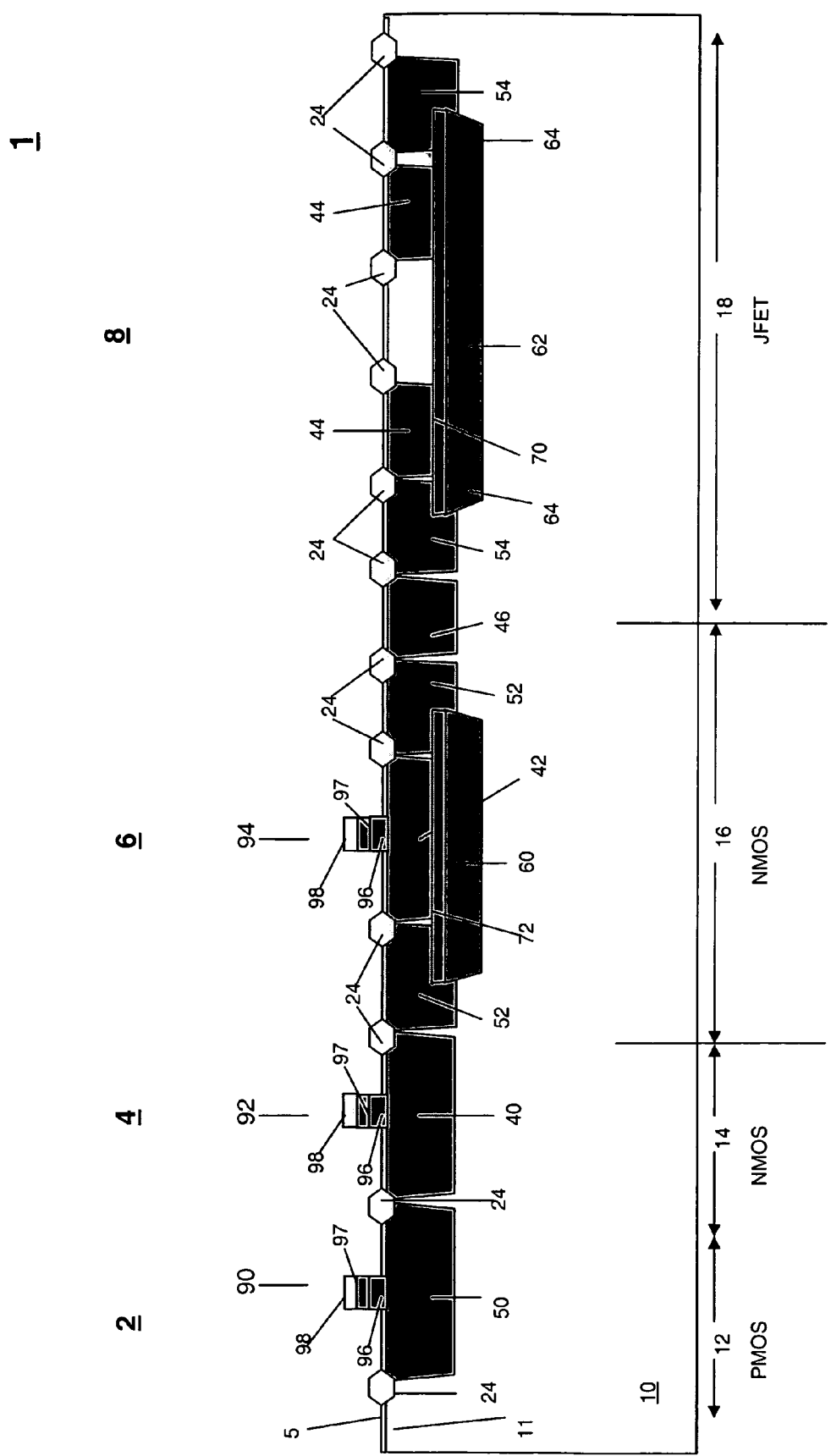

Fabrication of the NMOS device 6 may, include a deeper, but lower dose implant for the formation of the n-type isolation region 60. In this example, the implant 58 as illustrated in FIG. 5 may be modified to include a $4\times10^{12}$ cm$^{-2}$ dose of phosphorus at an energy on the order of 1400 keV. In this alternative step, the lower gate region 62 would be formed deeper within the semiconductor layer 10. When the lighter, deeper implant is used, the implant 68, as shown in FIG. 6, may be modified to include an $8\times10^{11}$ cm$^{-2}$ dose of boron with an energy on the order of 350 keV to form the p-doped channel region 70 farther from the surface.

Note, because p-type region 72 is substantially below the active regions of device 6, it has a minimal effect on the performance of the device 6. The dopant introduced into region 72 is of the same conductivity type as the net type already present in the p-well 42, but is on the order of only about one tenth the concentration of the dopant in the p-well 42. Therefore, in this sample illustration, the region 72 has little or no influence on the performance or operation of the NMOS device 6. However, as a matter of design choice, the nature of the implant may impart changes in the NMOS 6 device characteristics, e.g., gate threshold voltage.

Although not illustrated, with conventional fabrication steps the gate structures 90, 92, and 94 may next be formed, including sub layers of gate oxide 96, polysilicon 97, and tungsten silicide 98. The sublayers 96, 97, and 98 may be patterned with a hard mask layer and etched using well-known photolithography and plasma etch techniques to form the gate structures 90, 92 and 94 shown in FIG. 8. After processing steps which strip the photo resist and clean the semiconductor layer 10, a heat treatment such as rapid thermal processing (RTP) may be applied.

Figure 8:
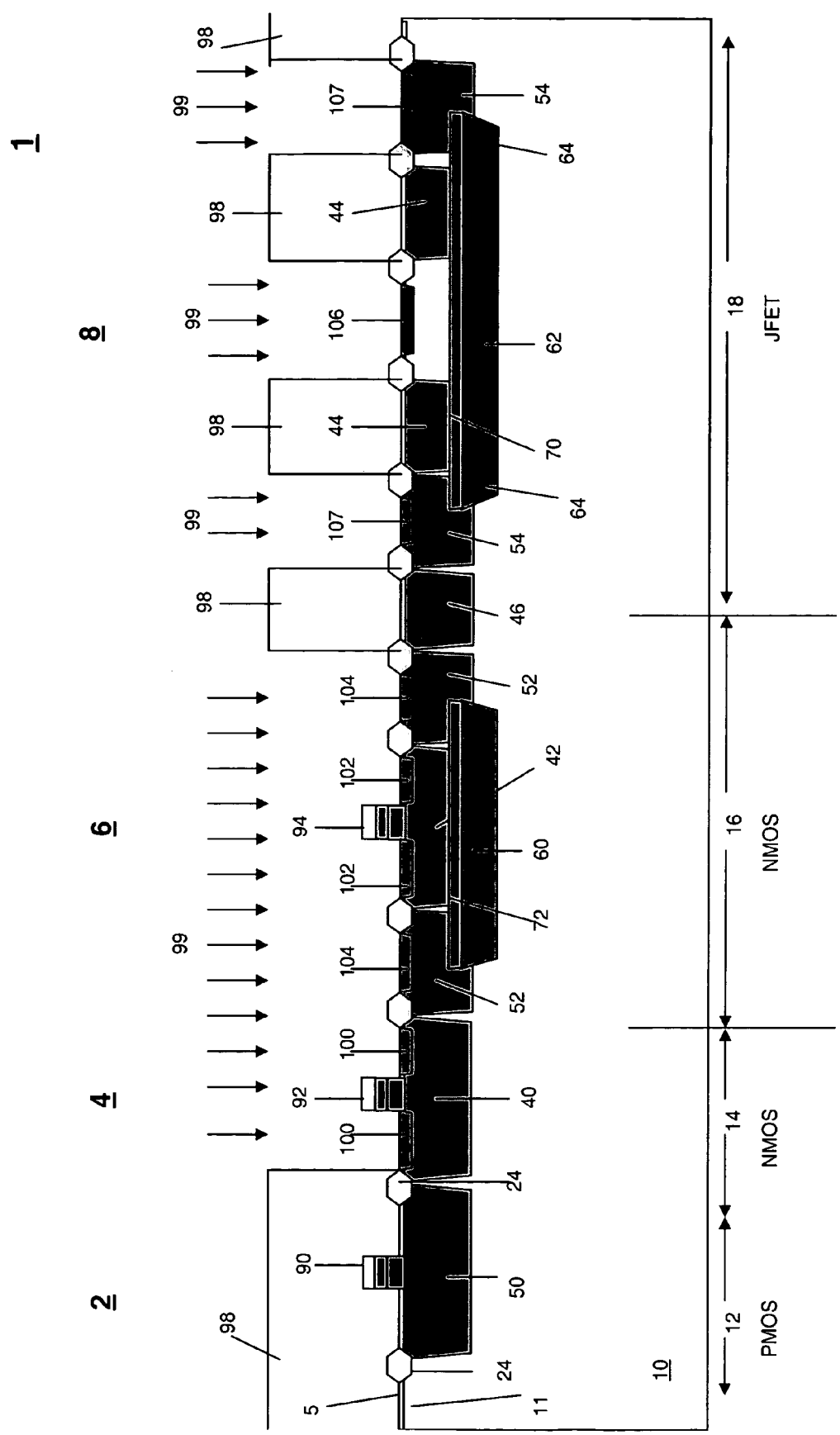

Referring next to FIG. 8, a photo resist layer 95 is deposited and patterned to define openings for n-type implant 99, which forms shallow, lightly-doped n-type regions 100 and 102 in the semiconductor surface 11 of NMOS transistors 4 and 6. The isolation region 52 also receives implant 99, slightly increasing the concentration of dopant in region 104. Simultaneously, the implant process 99 forms shallow, lightly-doped n-type regions 106 and 107 in the JFET device 8. The implant 99 may consist of a $6\times10^{13}$ cm$^{-2}$ dose of phosphorus implanted at an energy on the order of 15 keV. Subsequently, with conventional plasma etch and clean techniques, photo resist layer 95 is removed and the semiconductor surface 11 is cleaned.

Figure 9:
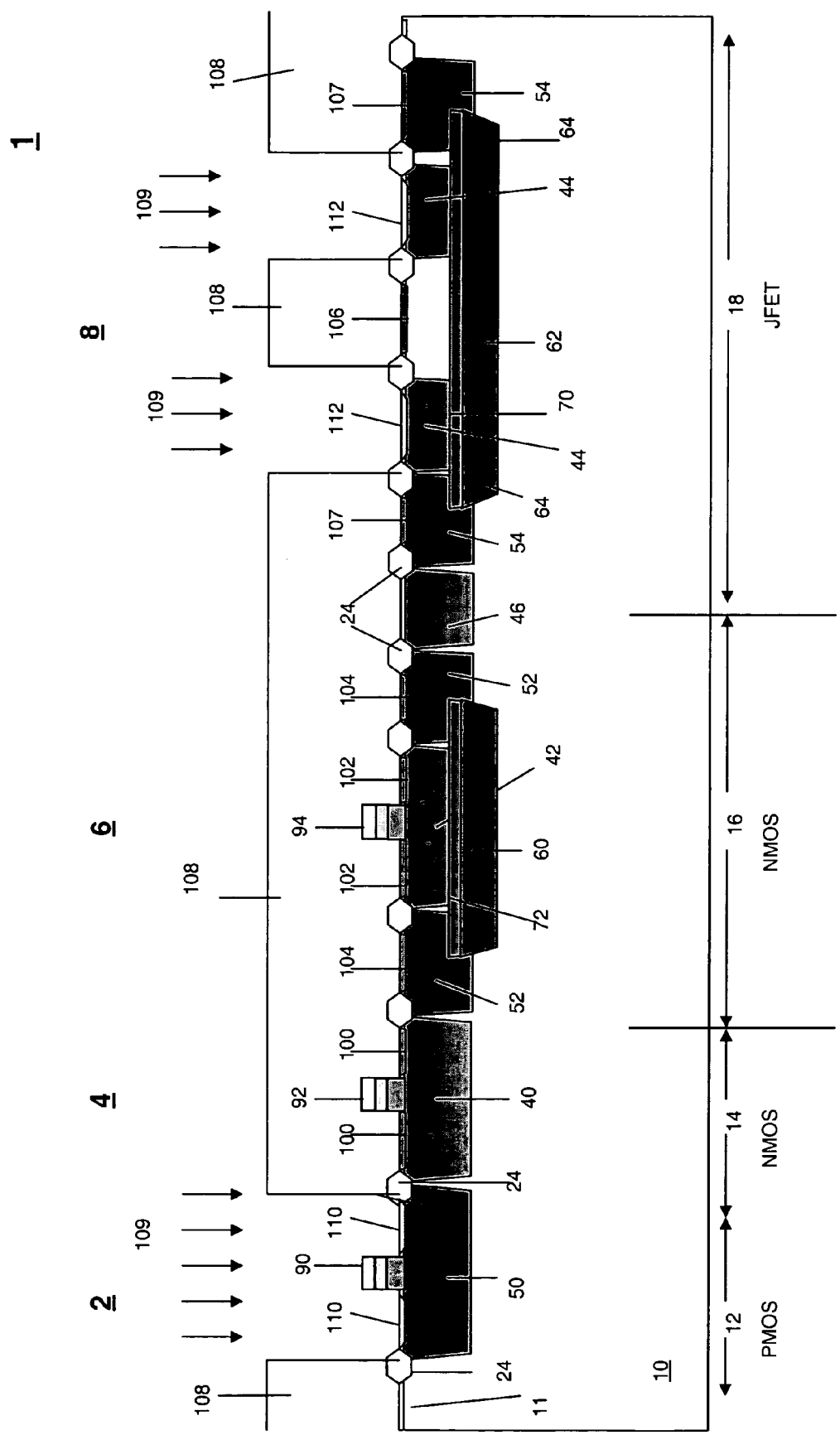

As illustrated in FIG. 9, a photo resist layer 108 is deposited and patterned, followed by implant 109, forming a shallow, lightly, p-doped region 110 in the PMOS transistor 2. Simultaneously, the implant process 109 increments the net p-type dopant concentration of region 112 of the JFET 8. The implant 109 may include a $10 \times 10^{12}$ cm$^{-2}$ dose of BF$_2$ implanted at an energy on the order of 25 keV. Subsequently, with conventional plasma etch and clean techniques, photo resist layer 108 is removed and the semiconductor surface 11 is cleaned.

Figure 10:
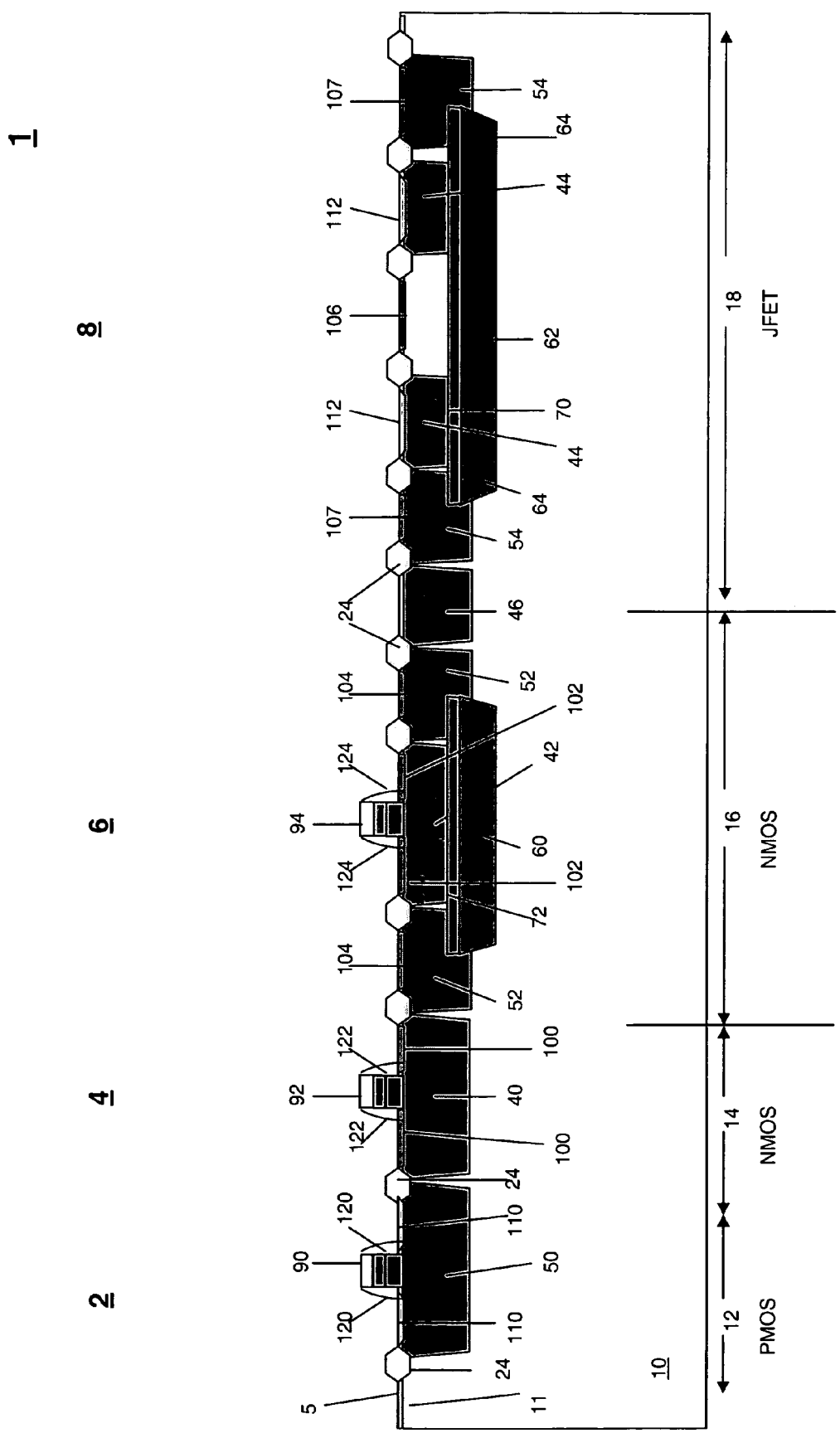

Referring next to FIG. 10, gate sidewall spacers 120, 122, and 124 are added to the gate structures 90, 92, and 94 of the PMOS 2, the NMOS 4, and the deep n-well NMOS 6 transistors using conventional methods. Although not illustrated, to form the sidewall spacers 120, 122, and 124, a tetraethyl orthosilicate silicon (TEOS)-based oxide layer is formed using, for example, low pressure chemical vapor deposition (LPCVD), this resulting in a layer thickness of 800 to 1600 Angstroms. The silicon dioxide layer is etched using conventional plasma etch and cleaning techniques to remove all but the sidewall spacer oxide. The temperatures of the processes creating the gate sidewall spacers 120, 122, and 124 are sufficiently low so as to not adversely affect the profiles of the doped regions forming the previously described structures of the JFET device 8.

Figure 11:
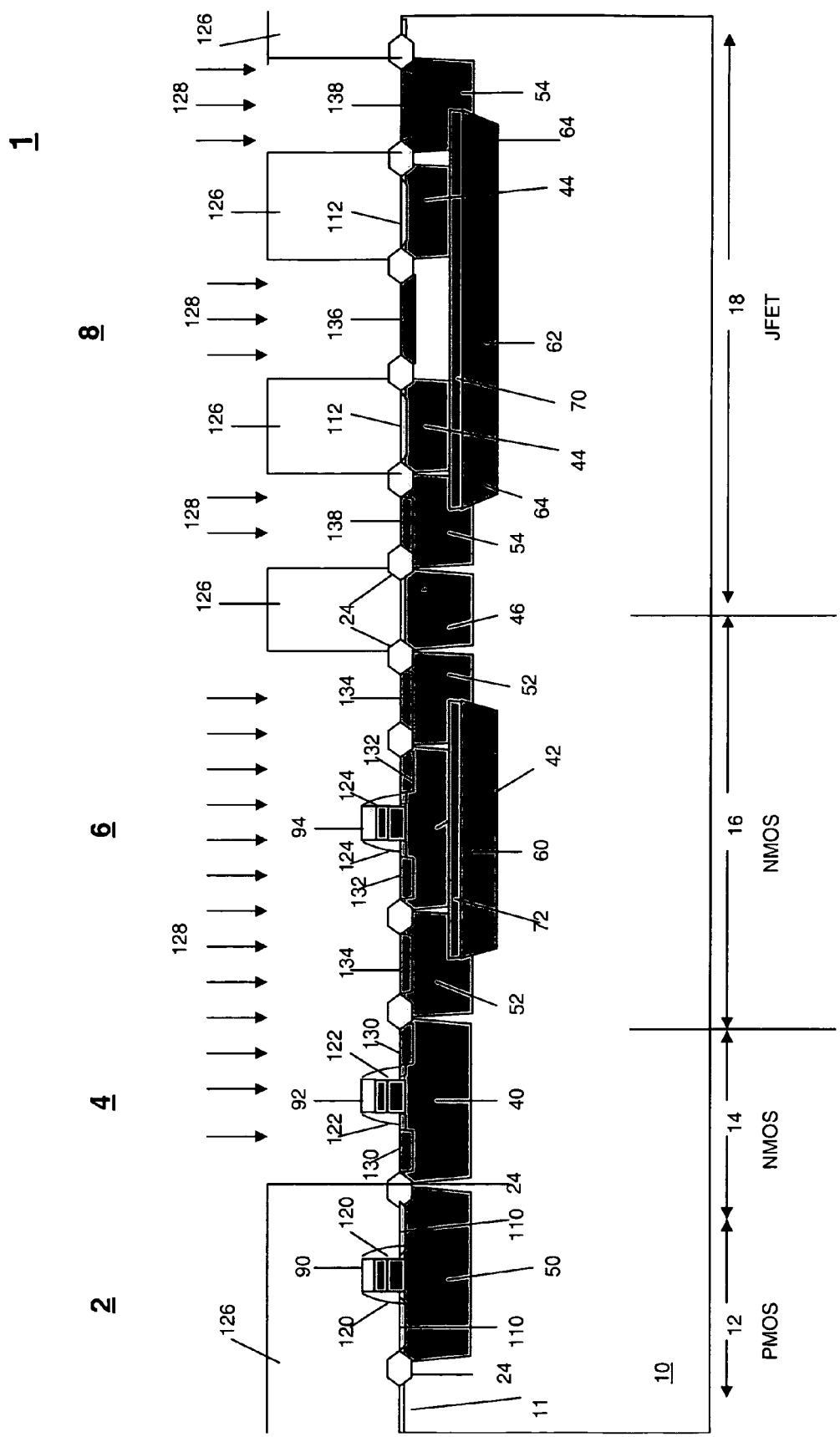

As illustrated in FIG. 11, a photo resist layer 126 is deposited and patterned, followed by an n-type implant 128 forming source/drain regions 130 of the NMOS transistor 4 and the source/drain regions 132 of NMOS transistor 6. The n-type contact regions 134 at the surface of n-type isolation region 52 of the NMOS transistor 6 are also formed with the implant 128. Simultaneously, implant 128 forms the upper gate region 136 and the n-contacts 138 of the JFET transistor 8. The implant 128 may consist of a $3.2 \times 10^{15}$ cm$^{-2}$ dose of arsenic implanted at an energy on the order of 50 keV.

Figure 12:
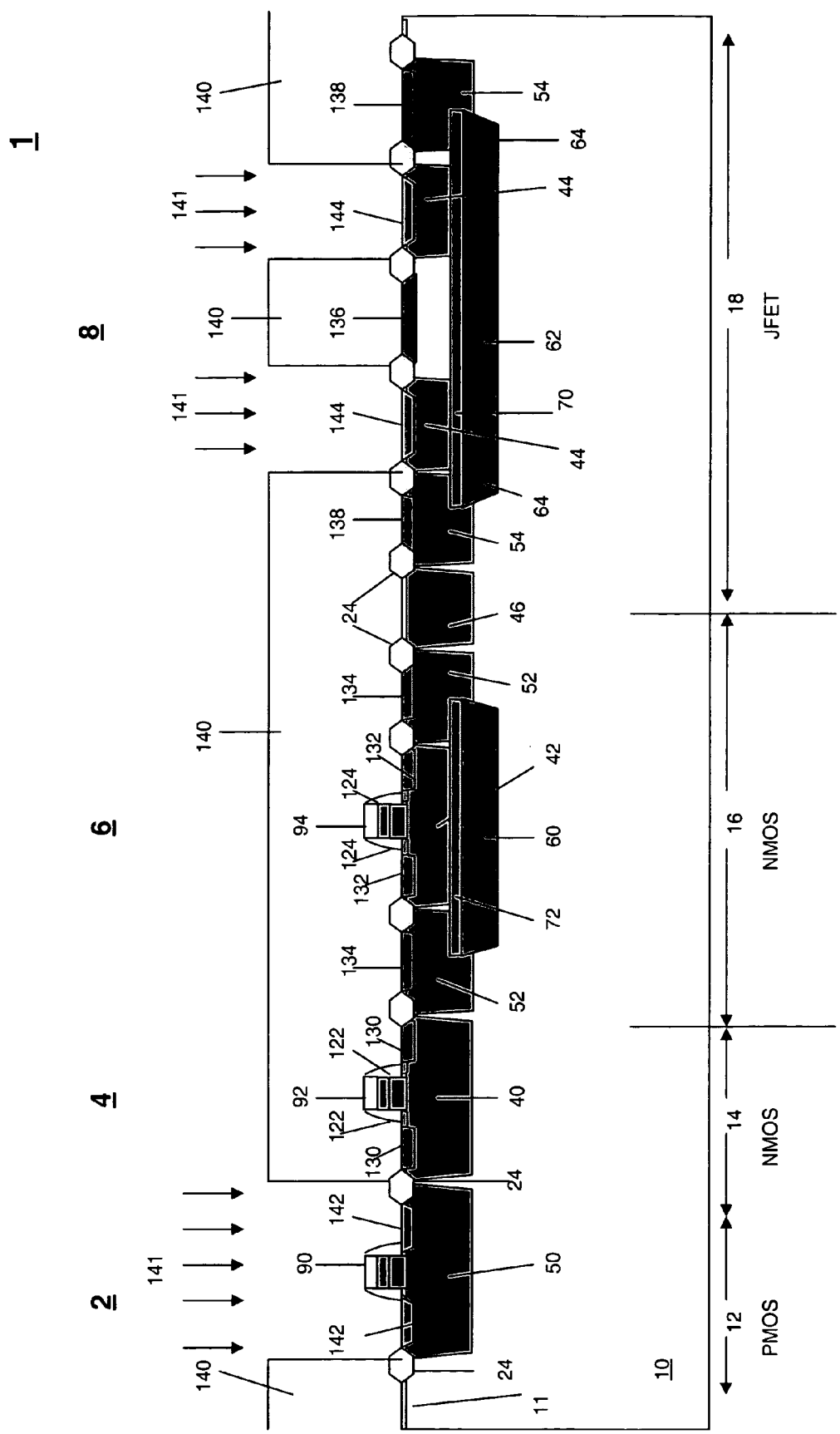

As illustrated in FIG. 12, a photo resist layer 140 is deposited and patterned, followed by a p-type implant 141 forming source/drain regions 142 of the PMOS transistor 2. Simultaneously, the implant 141 provides a p-type dopant into upper portions 144 forming source/drain contacts to the source/drain regions 44 of the JFET transistor 8. The implant 141 may include a $3.2 \times 10^{15}$ cm$^{-2}$ dose of BF$_2$ implanted at an energy on the order of 35 keV.

Conventional processing follows to complete the transistors 2, 4, 6 and 8.

Figure 13:
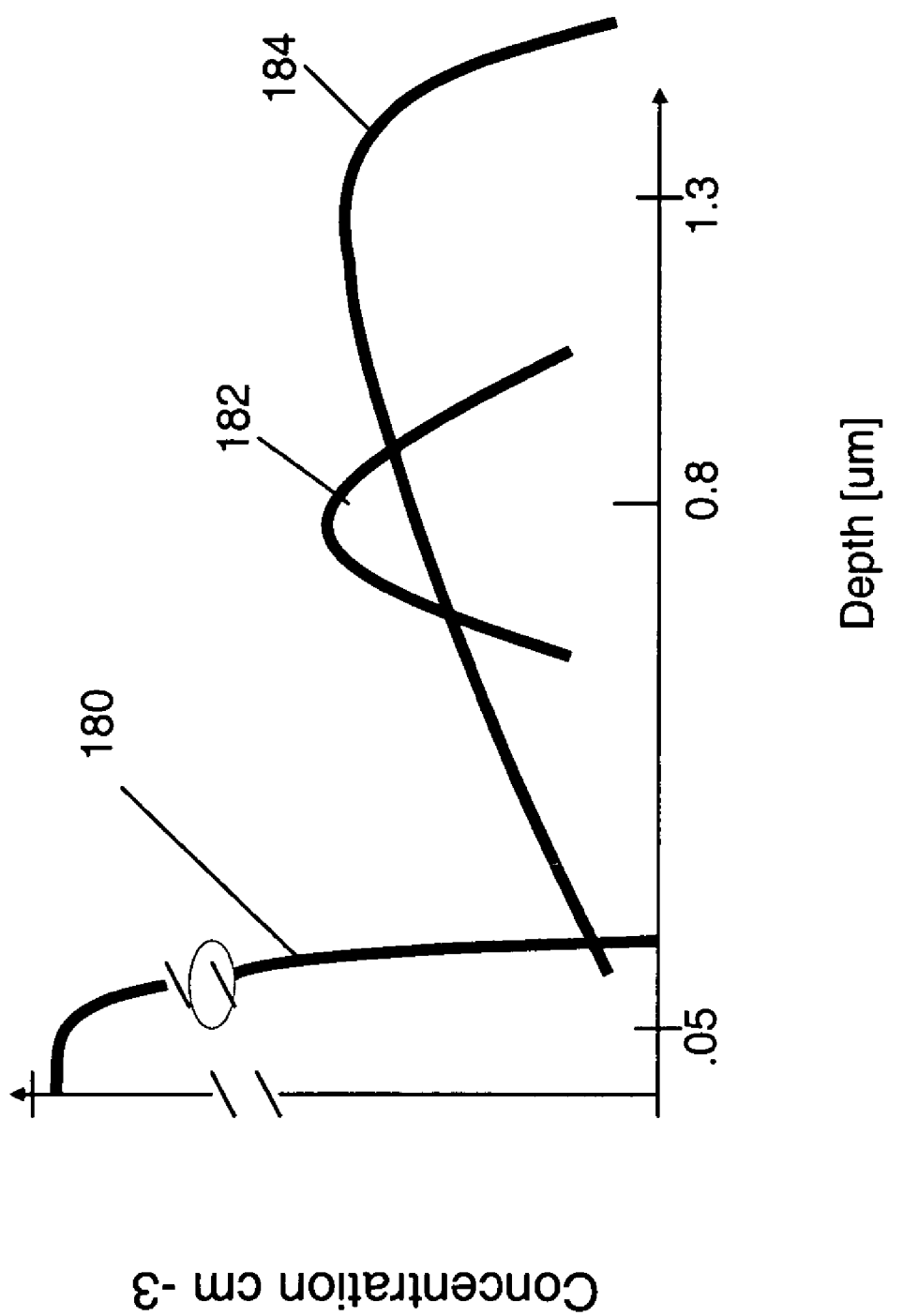
FIG. 13 through 15 illustrate dopant profiles for exemplary JFETs according to the invention.

The performance of the JFET transistor 8 is dependent on the location of the p-channel 70 and (ideally) the peak of the post diffusion p-type dopant in the channel 80 is substantially spaced from the post diffusion peaks of the lower and upper gates 62 and 136. FIG. 13 illustrates a dopant profile for the silicon region surrounding the p-channel 70. Curve 180 indicates the concentration of the n-type dopant of the upper gate 136 with a peak concentration at approximately 0.05 microns from the semiconductor surface 11. Curve 184 indicates the dopant profile of lower gate 62, having a peak at approximately 1.3 microns from the semiconductor surface 11. The curve 182 indicates the dopant profile of the p-type channel 70 of the JFET 8 with a peak at approximately 0.8 um from the semiconductor surface 11, this peak located between the two n-type peaks of the lower and upper gates 62 and 136. Numerous modifications of the JFET 8, as formed on the integrated circuit device 1 are contemplated. For example, a JFET which may also be formed along the semiconductor surface 11 may include only one gate region for controlling operation of the channel 70. See FIG. 17 which illustrates such a JFET 280 formed without an upper gate region, having a lightly doped p-type region 282 in place of upper gate region 136 of the JFET 8. In addition, field oxide 24a may be formed over the entire region 182, as also shown in FIG. 17.

Figure 14:
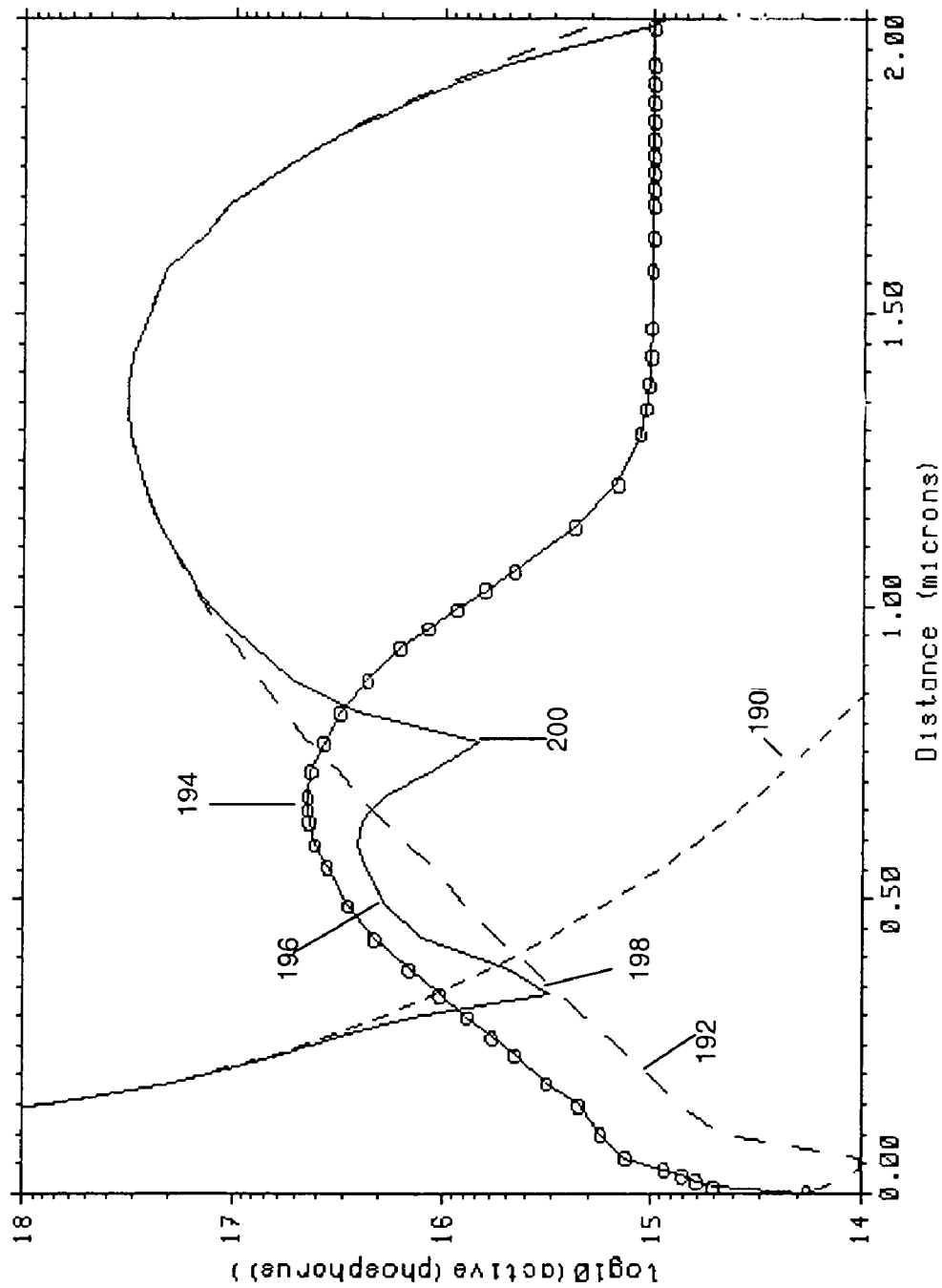

FIG. 14 illustrates a dopant profile for the JFET 8 with distance from the semiconductor surface 11. Curve 190 indicates the dopant concentration for n-type implant 128 forming the upper gate region 138 of the JFET 8. Curve 192 indicates the dopant concentration for implant 58 forming the lower gate region 62, and curve 194 indicates the dopant concentration from implant 68 forming the p-channel region 70 of the JFET 8. Solid curve 196 indicates the net dopant concentration of these implant into from the semiconductor surface 11 into the layer 10. At location 198 on curve 196, the n-type dopant of the upper gate region 138 intersects with the p-type dopant of the p-channel region 70. At location 200 on curve 196, the p-type dopant of the p-channel region 70 intersects with the n-type dopant of the lower gate region 62. The peak concentration of the channel 70 is in the range of $2 \times 10^{16}$ cm$^{-3}$ to $5 \times 10^{16}$ cm$^{-3}$, and preferably at $4 \times 10^{16}$ cm$^{-3}$, the peak being positioned in the semiconductor layer 10 between 0.4 and 1.0 micron below the semiconductor surface 11.

Figure 15:
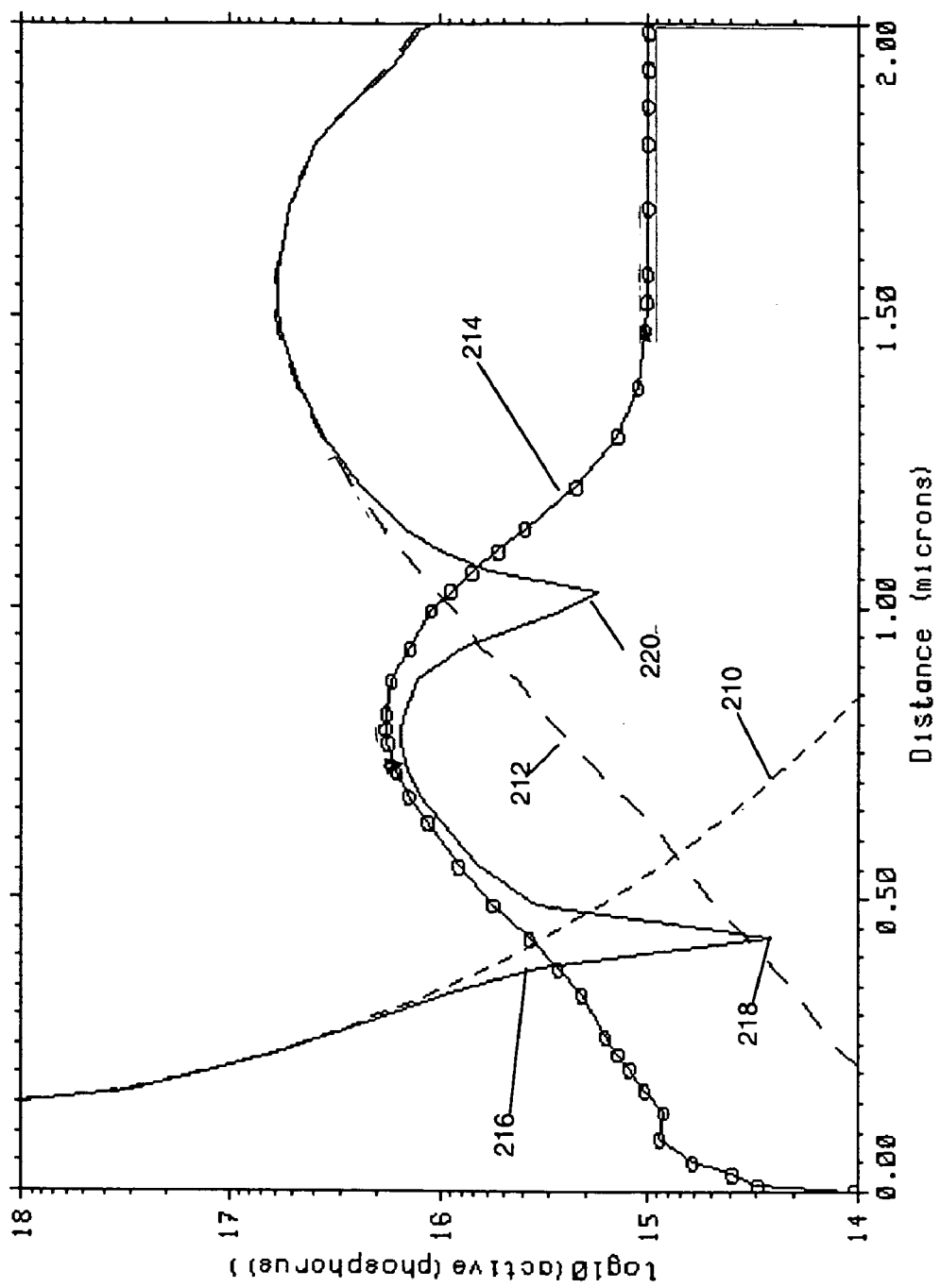

FIG. 15 illustrates a dopant profile for a second embodiment of the JFET 8. Curve 210 indicates the dopant concentration for a modified n-type implant forming the upper gate region 138 of the JFET 8. Curve 212 indicates the dopant concentration for a modified implant forming the lower gate region 62, and curve 214 indicates the dopant concentration from a modified implant forming the p-channel region 70 of the JFET 8. Solid curve 216 indicates the net dopant concentration of the implants into from the semiconductor surface 11 into the layer 10. At location 218 on curve 216, the n-type dopant of the upper gate region 138 intersects with the p-type dopant of the p-channel region 70. At location 220 on curve 216, the p-type dopant of the p-channel region 70 intersects with the n-type dopant of the lower gate region 62. The peak concentration of the channel 70 is in the range of $1 \times 10^{16}$ cm$^{-3}$ to $5 \times 10^{16}$ cm$^{-3}$, and preferably at $2 \times 10^{16}$ cm$^{-3}$, the peak being positioned in the semiconductor layer 10 between 0.5 and 1.1 microns below the semiconductor surface 11.

Figure 16:
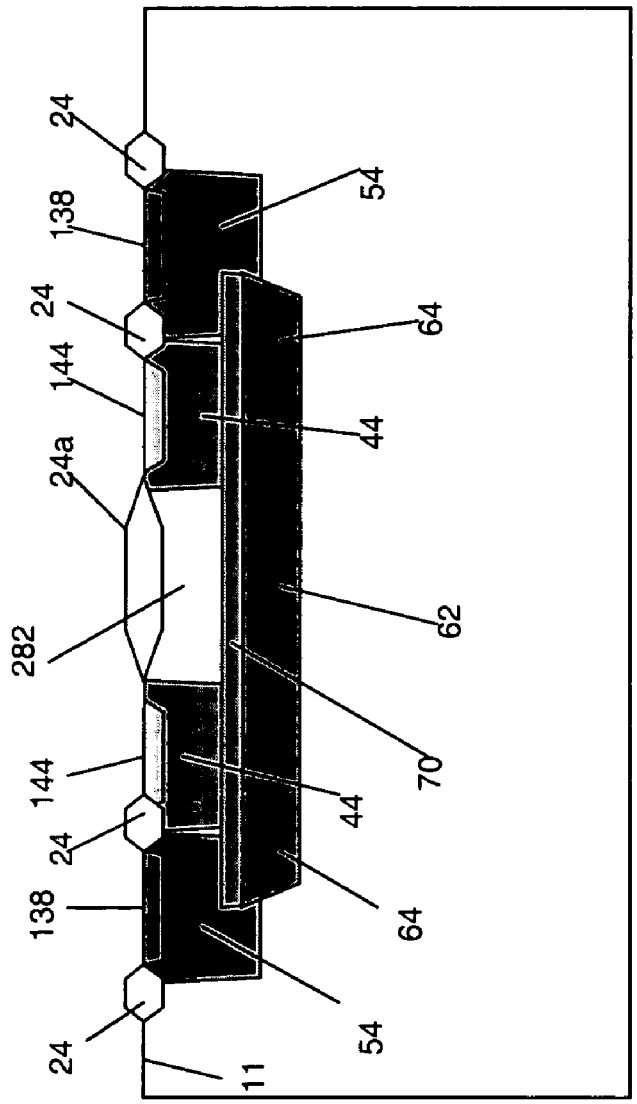
FIG. 16 illustrates an embodiment of a JFET device according to the invention.

Numerous modifications of the JFET 8, as formed on the integrated circuit device 1 are contemplated. For example, a JFET which may also be formed along the semiconductor surface 11 may include only one gate region for controlling operation of the channel 70. See FIG. 16 which illustrates such a JFET 280 formed without an upper gate region, having a lightly doped p-type region 282 in place of upper gate region 136 of the JFET 8. In addition, field oxide 24a may be formed over the entire region 282, as also shown in FIG. 16.

An integrated circuit device including CMOS transistors and at least a JFET transistor and a method for fabricating such a device have been described. Specific applications and exemplary embodiments of the invention have been illustrated and discussed, which provide a basis for practicing the invention in a variety of ways. Numerous variations are possible within the scope of the invention. Features and elements associated with one or more of the described embodiments are not to be construed as required elements for all embodiments. The invention is limited only by the claims that follow.

What is claimed is:

1. An integrated circuit, comprising:
   a semiconductor layer of a first conductivity type having an upper surface;
   a depletion-mode transistor that comprises:
      a source region and a drain region, each extending from the upper surface into the semiconductor layer; and
      a channel region of the first conductivity type located at a first distance from the upper surface and laterally extending between the source region and the drain region;
   a first gate of a second conductivity type comprising:

a first gate region located at a second distance from the upper surface greater than the first distance, said first gate region being adjacent to the channel region; and a first well that laterally surrounds the semiconductor channel and extends from the upper surface to the first gate region; and a second gate of the second conductivity type positioned adjacent to the upper surface between the source region and the drain region; and a MOS transistor that comprises:

a second well for operatively forming therein a second-conductivity-type channel for conducting charges between a source and a drain of the MOS transistor, said second well being a well of the first conductivity type and extending from the upper surface into the semiconductor layer; and an isolation structure of the second conductivity type comprising:

a third well that extends from the upper surface into the semiconductor layer and laterally surrounds the second well; and an isolation region located at the second distance from the upper surface and laterally extending between sides of the third well to enable the isolation structure to isolate the second well from at least a portion of the semiconductor layer.

2. The integrated circuit of claim 1, wherein:
the first conductivity type is a p type; and
the second conductivity type is an n type.

3. The integrated circuit of claim 1, wherein the first gate separates the semiconductor channel from the portion of the semiconductor layer.

4. The integrated circuit of claim 1, wherein the channel region has a peak dopant concentration at a distance of at least 0.5 micron from the upper surface.

5. The integrated circuit of claim 1, wherein a semiconductor region located between the upper surface and the channel region has a net concentration of a dopant corresponding to the first conductivity type of less than about $10^{16}$ cm$^{-3}$.

6. The integrated circuit of claim 5, wherein the semiconductor region located between the upper surface and the channel region is positioned at a distance of about 0.3 micron from the upper surface.

7. The integrated circuit of claim 1, wherein the MOS transistor further comprises a region of the first conductivity type located at the first distance from the upper surface and laterally extending between the sides of the third well.

8. The integrated circuit of claim 7, wherein said region of the first conductivity type located at the first distance is positioned along a lower portion of the second well.

9. The integrated circuit of claim 7, wherein the isolation structure isolates said region of the first conductivity type located at the first distance from the portion of the semiconductor layer.

10. The integrated circuit of claim 7, wherein said region of the first conductivity type located at the first distance has a dopant concentration that is at least as high as a net dopant concentration in the channel region.

* * * * *

UNITED STATES PATENT AND TRADEMARK OFFICE
CERTIFICATE OF CORRECTION

PATENT NO. : 7,642,617 B2　　　　　　　　　　　　　　　　　　　　　　　　Page 1 of 1
APPLICATION NO. : 11/237095
DATED : January 5, 2010
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 687 days.

Signed and Sealed this

Twenty-first Day of December, 2010

David J. Kappos
*Director of the United States Patent and Trademark Office*